Figure 1:
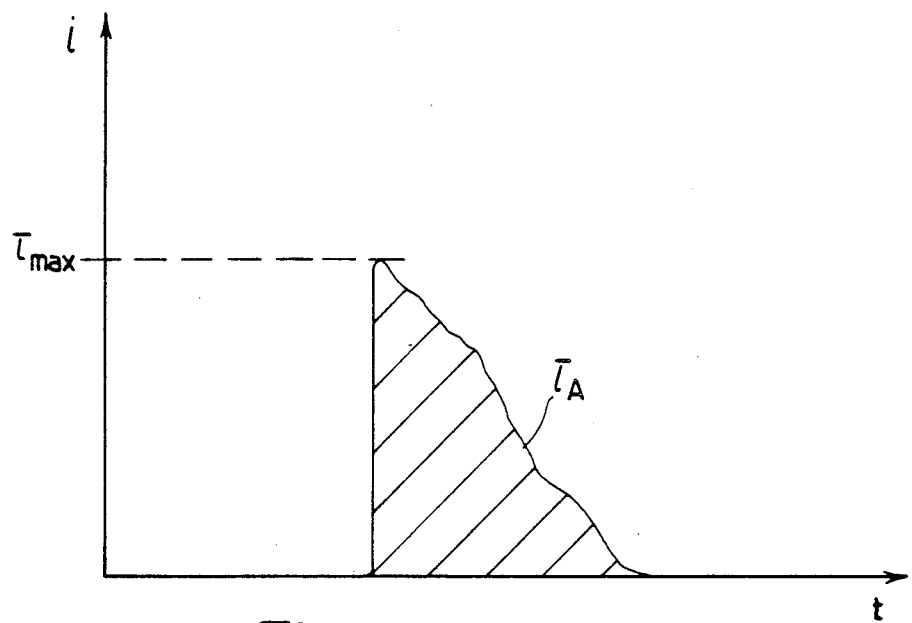

United States Patent [19]

Donner

[11] Patent Number: 4,896,114
[45] Date of Patent: Jan. 23, 1990

[54] CABLE FAULT DETECTOR

[75] Inventor: Marcus Donner, Helsinki, Finland

[73] Assignee: Oy Elecid Ab, Helsinki, Finland

[21] Appl. No.: 235,899

[22] PCT Filed: Dec. 29, 1986

[86] PCT No.: PCT/FI86/00156

§ 371 Date: Aug. 25, 1988

§ 102(e) Date: Aug. 25, 1988

[87] PCT Pub. No.: WO88/05171

PCT Pub. Date: Jul. 14, 1988

[51] Int. Cl.$^4$ .............................................. G01R 31/08
[52] U.S. Cl. .................................... 324/522; 324/536; 377/26
[58] Field of Search ............... 324/522, 525, 509, 512, 324/537, 539, 541, 526, 523, 66, 536; 379/26, 25

[56] References Cited

U.S. PATENT DOCUMENTS

| 1,865,687 | 7/1932 | Graf | 324/523 |
| 3,248,646 | 4/1966 | Brazee | 324/525 X |
| 3,284,704 | 11/1966 | Lamont | 324/523 |
| 4,241,305 | 12/1980 | Dickerson | 324/532 |
| 4,278,931 | 7/1981 | Huggins | 324/523 |
| 4,424,479 | 1/1984 | Brown | 324/525 |
| 4,446,421 | 5/1984 | Berde | 324/523 |

Primary Examiner—Reinhard J. Eisenzopf
Assistant Examiner—Robert W. Mueller
Attorney, Agent, or Firm—Barnes & Thornburg

[57] ABSTRACT

A method for detecting a fault, e.g. a short circuit, break or leakage in an electric cable or conductor, whereby two conductor pairs (1,2 and 4,5), one of which comprises the faulty conductor (1), are connected in such a way as to form a double loop (1,5 and 2,4), a voltage pulse being applied to the intact loop (2,4) to locate the fault (X). Depending on the nature of the defect, the pulse voltage is adjusted to a level sufficient to produce a malfunction, e.g. sparking, in the defective loop (1,5), whereupon the ratio of the currents produced at the ends of this loop is measured and the proportion ($U_1/U_2$) is translated into a distance of the fault from the detector.

9 Claims, 1 Drawing Sheet

CABLE FAULT DETECTOR

Method and means for detecting a fault, e.g. a short circuit, break or leakage, in an electric cable or conductor, whereby two conductor pairs, one of which comprises the faulty conductor, are connected in such a way as to form a double loop, a voltage pulse being applied to one of the loops to locate the fault.

As the density and rates of traffic increase, especially in cables for data communication, maintaining the quality and reliability of cables requires a great deal of attention. It is important that cable faults be quickly and reliably located.

At present, accurate methods for detecting cable faults exist, in which a detector is connected to a pair in which one conductor is faulty and the other one intact, cable faults being generally due to discharges between the condcutors of a given pair. Voltage pulses are then fed into the conductor pair to 'burn' through the defective area, producing a permanent short circuit, whereupon the distance of the fault from the detector can be calculated from a simple equation by using a Wheatstone bridge balanced with a precision potentiometer, the total length of the conductor being known.

'Conductor pair' in this context refers both to pairs consisting of ordinary conductors and to pairs consisting e.g. of one of the conductors in a coaxial cable and the cable shield acting as the other conductor.

While faults can be accurately located by this type of methods, they have the significant drawback that burning through the defective area involves a considerable risk of destroying other conductors in the vicinity of the pair under treatment, in which case several pairs or even the whole cable have to be replaced. For this reason and also because the detector used for indicating the measurement result, frequently a precision potentiometer, has to be correctly calibrated, reset and used with great precision to ensure correct results, applying such methods requires great skill.

The object of the present invention is to create a simple method and means by which cable faults can be located without the disadvantages mentioned. To achieve this object, the method of the invention is characterized in that a voltage pulse is applied to the intact branch of the double loop formed, the pulse voltage being adjusted according to the nature of the fault to a level sufficient to produce a malfunction, e.g. sparking, in the faulty loop, whereupon the current pulses produced at the ends of this loop are detected and the ratio of these current values is measured and translated into a distance of the fault from the detector.

The invention offers the advantages that the measuring equipment is light and simple, the measurement is easy to perform, the conductors are not subjected to long high-voltage pulses to produce a full short circuit condition between them, but instead a high-voltage pulse is fed into the intact loop, from which it jumps over via the defective area to the faulty conductor.

The device applying the method of the invention, consisting of a high-voltage pulse generator and circuits for measuring the currents produced in the defective conductor, is characterized in that the characteristic values of the current pulses produced in the defective loop and converted into voltages by means of resistors can be sensed at both ends of the loop by means of detectors, which feed the inputs of a digital voltmeter with voltages proportional to the characteristic values of the current pulses to indicate the ratio between them.

Other advantageous embodiments of the invention are characterized by what is presented in the claims to follow.

In the following, the invention is described in detail by the aid of an example, reference being made to the drawing attached, wherein:

FIG. 1 presents a typical form of the current pulses to be measured.

Figure 2:
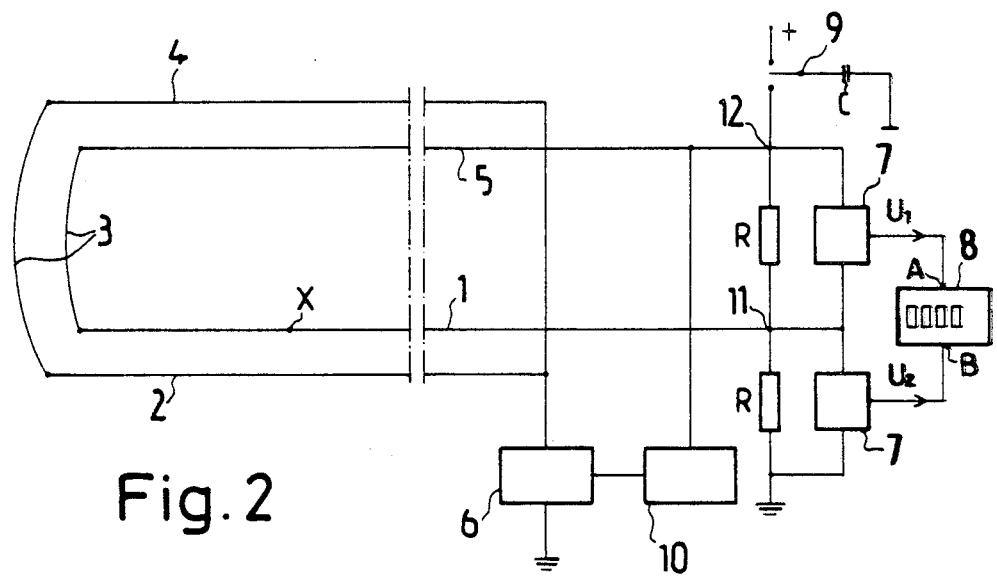

FIG. 2 presents the circuit principle of the device applying the method of the invention.

To measure the current pulse shown in FIG. 1, produced in the defective area of the conductor by an external high-voltage pulse, two methods as provided by the invention can be applied: either the maximum pulse value $i_{max}$ is measured or the current is integrated with respect to time, in which case the proportional quantity will be the pulse energy, graphically represented in FIG. 1 by the pulse area $i_A$.

Main parts of the device of the invention as shown in FIG. 2 are a high-voltage pulse generator 6, control logic (microcomputer) 10, peak voltage detectors 7, a digital voltmeter 8 and a calibration switch 9. Equal resistors R ensure that the voltages and voltage changes applied to the two detectors 7 are mutually comparable.

According to the method of the invention, two conductor loops 1,5 and 2,4 are formed from the conductors of the pair 1,2 containing the faulty conductor 1 and another pair 4,5 which is intact, by connecting jumpers 3 between the ends of the conductors e.g. at the nearest exchange in the manner shown in FIG. 2. At the exchange where the measurement is performed, a device as provided by the invention is connected to the corresponding ends of the loops 1,5 and 2,4 in a manner explained later on.

The digital voltmeter 8 used as a ratio detector is calibrated by turning the switch 9 to the position in which the capacitor C is discharged via the resistors R, producing equal voltages across each. The detectors 7 register the voltage pulses corresponding to the current peak values and feed these voltages $U_1$ and $U_2$ to the inputs A and B of the digital voltmeter 8. Input A is the measurement input, whereas B is a reference input. Voltage U2 is the sum of the signal fed in and the signal returned, this sum being applied to the reference input B of the digital voltmeter 8. The voltmeter is calibrated by means of a potentiometer incorporated, repeating the calibration procedure described above if necessary, until it shows equal values for the voltages $U_1$ and $U_2$.

After calibration, a voltage pulse is produced by the high-voltage pulse generator 6, the voltage being adjusted to a sufficient level depending on the nature of the fault, and applied to the loop 2,4. The pulse produces a malfunction, e.g. sparking, at the defect X in conductor 1. The currents thus generated in the conductor loop 1,5 are measured via the resistors R by the detectors 7. The high-voltage return current in conductor 4 is monitored by the control logic 10, which controls the pulse frequency of the high-voltage generator 6. It is generally sufficient to produce only one pulse of correct dimensions to perform the measurement. The pulse amplitude is set e.g. manually to a level depending on the properties of the conductors. Otherwise the signals produced by the voltage pulses are handled as described above in connection with the calibration procedure.

When there is a fault in conductor 1, the voltage pulse jumps over, e.g. via an arc, to the other conductor of the pair as explained in the description of the state of the art, but without producing a definite short circuit between the conductors. This is unnecessary because in the method proposed the characteristics of short current pulses are registered without using precisely balanced resistor bridges, which necessitate a mechanical contact at the point of the short circuit and long measuring pulses to enable the fault to be located. The fault is located as in known methods and as explained before by determining the ratio of the input and return currents, as the currents flowing in opposite directions from the fault X in the loop 1,5 are, as stated by Ohm's law, proportional to the resistance present (the voltage supplied by the generator 6 is constant during the pulse) or to the corresponding capacitance of the conductors. Measurement based on capacitance is applicable when the fault X is a break in the conductor, in which case the generator voltage pulses have to be fed in via a contact breaker, e.g. a sparking plug, to produce a sufficiently fast electric change to enable the conductor capacitance to be measured.

The ratio $U_1/U_2$ is equal to the ratio of the distance between the fault and connector 11 to the total length of the loop 1,5 between connectors 11 and 12. The principle of determining the latter ratio directly from the conductor resistances is known in the art and will not be discussed here. The final measurement result is obtained from the voltmeter reading by translating, using a table or a simple equation, the deviation between the reading and the calibrated value into a distance. The voltmeter is preferably connected to a logic circuit which automatically calculates and indicates the fault distance on the basis of the total conductor length, which is input beforehand.

Instead of current peak value detectors 7, it is possible to use circuits which calculate the current energy by integrating the current with respect to time, the energy values obtained being applied to the inputs of the digital voltmeter.

It is obvious to a person skilled in the art that the embodiments of the invention are not restricted to the example described above, but that they may instead be varied within the scope of the following claims.

I claim:

1. Method for detecting a fault, e.g. a short circuit, break or leakage in an electric cable or conductor, whereby two conductor pairs (1,2 and 4,5), one of which comprises the faulty conductor (1), are connected in such a way as to form a a pair of closed loops (1,5 and 2,4), a voltage pulse being applied to one (2,4) of the closed loops to locate the fault (X), wherein the pulse is applied to the intact (2,4) loop of the pair of closed loops, the pulse voltage being adjusted according to the nature of the fault to a level sufficient to produce a malfunction, e.g. sparking, in the defective loop (1,5), whereupon the current pulses produced at the ends of this loop are detected and the ratio of these current values ($I_{max}$; $I_A$) is measured and translated into a distance of the fault from the detector.

2. Method according to claim 1, wherein the ratio of input current to return current is calculated as the ratio of the maximum current values ($i_{max}$) of the input and return pulses.

3. Method according to claim 1, wherein the ratio of input current to return current is calculated as the ratio of the energy contents ($i_A$) of the input and return pulses.

4. A device for detecting a fault in a cable conductor comprising:
   connecting means for connecting four conductors as pairs to form a pair of closed loops having an intact loop and a defective loop containing the fault, the defective loop having an input end and an output end;
   pulse applying means for applying a high-voltage pulse to the intact loop sufficient, depending on the nature of the fault, to produce a malfunction in the effective loop resulting in an input current pulse at the input end and a return current pulse at the return end of the defective loop;
   detector means for detecting the input and return current pulses at the ends of the defective loop; and
   measuring means for measuring a ratio of the current pulses produced at the input end and return end of the defective loop.

5. A device according to claim 4, wherein the detector means comprises a first detector connected to the input end and a second detector connected to the return end, the first and second detectors detecting a peak current value.

6. A device according to claim 4, wherein the detector means comprises first and second detectors connected respectively to the input and return ends of the defective loop, the first and second detectors having integrating circuits for measuring current energy.

7. A device according to claim 4, further comprising current to voltage converting means for converting the input current pulse and return current pulse to voltages proportional to current values of the input and return current pulses.

8. A device according to claim 7, wherein the detector means detects a voltage pulse corresponding to the current values of the input and return current pulses.

9. A device according to claim 8, wherein the measuring means is a digital voltmeter for measuring the voltages detected by the detector means to form a ratio proportional to the current values of the input and return current pulses.

* * * * *